United States Patent [19]

Streiber

[11] Patent Number: 4,496,853

[45] Date of Patent: Jan. 29, 1985

[54] STATIC LOAD FOR HIGH VOLTAGE DRIVER

[75] Inventor: Ronald W. Streiber, Smithtown, N.Y.

[73] Assignee: General Instrument Corporation, New York, N.Y.

[21] Appl. No.: 440,109

[22] Filed: Nov. 8, 1982

[51] Int. Cl.³ .................. H03K 3/01; H03K 17/687
[52] U.S. Cl. .................. 307/270; 307/571; 307/581
[58] Field of Search ........... 307/270, 246, 571, 200 B, 307/304, 574, 581

[56] References Cited

U.S. PATENT DOCUMENTS 4,000,429 12/1976 Yoshida et al. .................. 307/246
4,069,430 1/1978 Masuda .................. 307/270
4,446,381 5/1984 Dalrymple .................. 307/200 B Primary Examiner—Stanley D. Miller
Assistant Examiner—B. P. Davis
Attorney, Agent, or Firm—Allan Jacobson

[57] ABSTRACT

A static load for a high voltage driver includes first and second depletion mode field effect transistors and a diode-connected enhancement mode field effect transistor. The static load is arranged with a switching transistor to form a high voltage driver circuit. When the output of the driver circuit is at a relatively low potential, current drawn from the high voltage power supply is substantially reduced by applying a source to gate potential through the diode-connected transistor to one of the depletion mode transistors below the threshold voltage of the depletion mode transistor.

11 Claims, 3 Drawing Figures

STATIC LOAD FOR HIGH VOLTAGE DRIVER

FIELD OF THE INVENTION

This invention relates to a high voltage driver for use in an integrated circuit (IC).

BACKGROUND OF THE INVENTION

In certain types of IC's, a driver circuit is needed for providing a high voltage signal. For example, in an electrically eraseable read-only memory (EEPROM), the erase, store, and write functions require a 25 volt signal, whereas the address and data signal functions only require a 5 volt signal.

Known driver circuits with typical static loads may be used with a 25 volt power source to provide a high voltage signal. However, the steady state current drawn from the 25 volt source may become excessive, particularly when a plurality of high voltage drivers are included on the same IC. The problem of excessive current consumption becomes particularly acute when the 25 volt power source is provided from a voltage multiplier on the same IC as the high voltage drivers. Since the high voltage multiplier often has limited capacity to supply output current, the total current required by a plurality of high voltage drivers may exceed the capacity of the high voltage multiplier.

In order to reduce current consumption, it is known to provide a high voltage driver circuit using dynamic clocking and a clocked load. However, such dynamic circuitry and the required system of clock timing signals tends to result in a more complex design requiring a larger circuit area as compared to a high voltage driver circuit using a static load.

SUMMARY OF THE INVENTION

The present invention is embodied in a static load circuit comprising a depletion mode field effect transistor (FET), a current source, and a unidirectional current conduction element arranged so that the static load circuit conducts substantially zero current from the relatively higher voltage power supply in the steady state.

The static load is used in conjunction with a switching transistor to form a high voltage driver circuit. When the output of the driver is at a relatively high potential, no current is drawn through the load since the potential difference across the load is relatively small, as is normally the case. However, when the output of the driver is at a relatively low potential, current drawn through the load from the relatively high voltage power supply is substantially reduced by applying a source to gate potential below the threshold voltage of the depletion mode FET.

DETAILED DESCRIPTION

Figure 2:
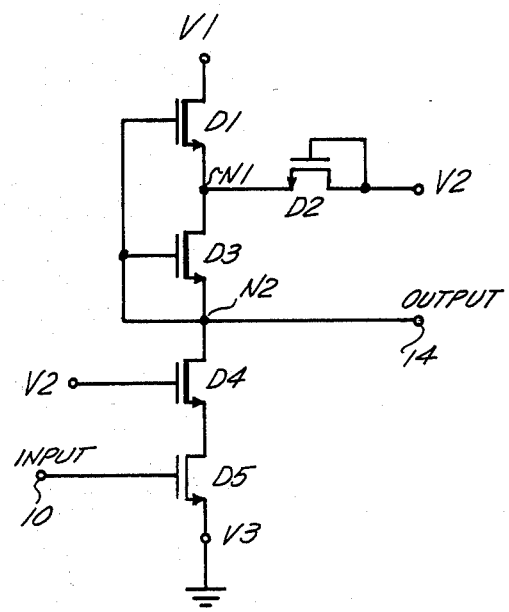
FIG. 2 is a specific embodiment of a high voltage driver circuit in accordance with the present invention.
Figure 1:
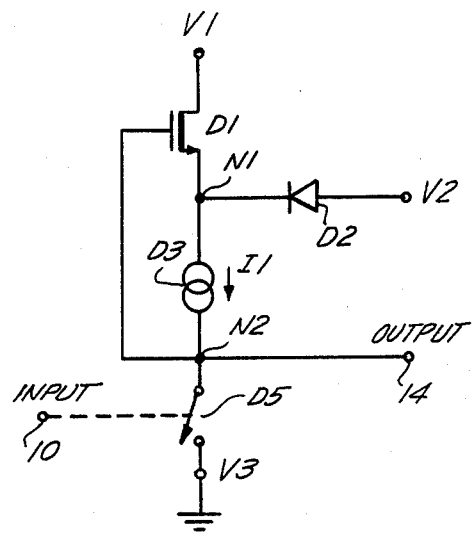
FIG. 1 is a high voltage driver circuit embodying the present invention.

The high voltage driver circuit shown in FIG. 1 comprises a switching element D5, and a static load arrangement which includes a diode D2, a current source D3, and a depletion mode FET D1.

The static load is connected between an output terminal 14 at circuit node N2, and a first power supply terminal for receiving an operating potential V1, typically +25 volts. Diode D2 is connected at the anode thereof to a second power supply terminal for receiving a source of operating potential V2, typically +5 volts.

Switching element D5 is connected between node N2 and a source of reference potential V3, typically 0 volts. Switching element D5 is responsive to a control signal on input terminal 10 thereof to selectively control the conductivity between its output terminals connected between node N2 and reference potential V3.

Figure 3:
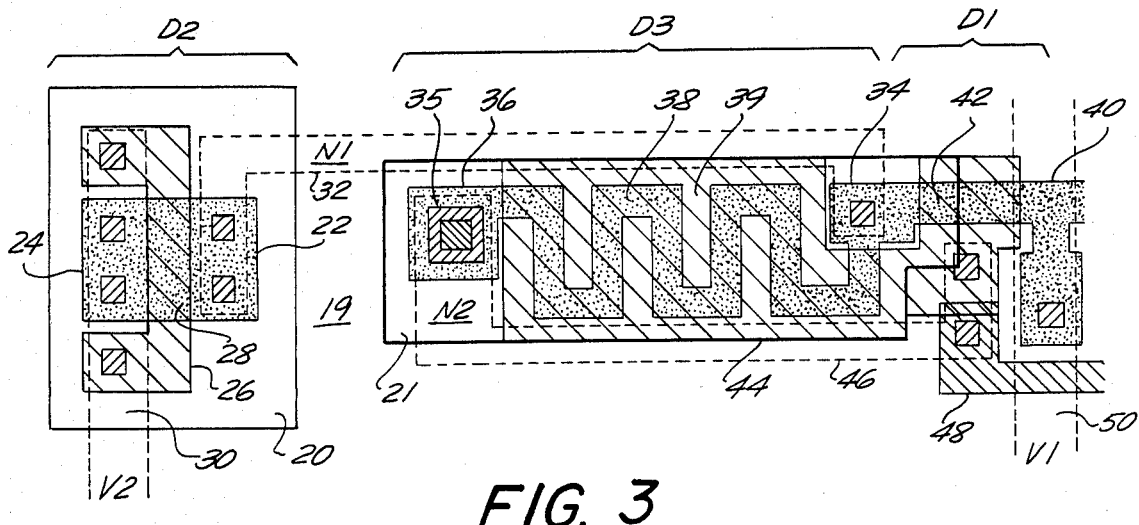
FIG. 3 is a composite layout of a static load circuit embodying the present invention.

FIG. 3 shows a specific embodiment of circuit elements D2, D3, D4 and D5. Diode D2 is shown as a diode-connected transistor. In particular, an enhancement mode FET is used, with the source electrode thereof as the cathode and the gate and drain electrodes connected together as the anode. Alternatively, D2 may be a PN junction or other unidirectional current conduction device.

Transistor D3, is a depletion node FET which is connected from source-to-gate in order to condition D3 to conduct a substantially constant current I1 between nodes N1 and N2. Other current source embodiments may be used. For example, a high value resistor may be connected between node N1 and N2 to approximate a current source.

Switching element D5 is an enhancement mode FET. The latter FET is connected in series with a depletion mode FET, D4, between N2 and power supply potential V3. The gate electrode of transistor D4 is connected to potential V2 which conditions D4 to be conductive at all times. The purpose of transistor D4 is to protect transistor D5 from breakdown due to exposure of excessively high voltages at node N2. However, if the drain to source breakdown voltage of D5 is sufficiently high, D4 may be replaced by a direct connection between the drain electrode of D5 of node N2.

In operation, a signal potential of 0 volts at input terminal 10 conditions transistor D5 to be non-conductive. In the steady state, node N2 is charged to a relatively high potential near 25 volts. Therefore, substantially zero current flows from the 25 volt source to node N2. Node N1 is also a near 25 volts so that diode D2 is reverse biased.

When the signal potential at input terminal 10 switches to 5 volts, transistor D5 is rendered conductive to discharge the capacitance at node N2. However, the change stored at node N1 is not discharged immediately. Therefore, transistor D1 is switched off very quickly after the input signal switches states. The voltage at node N1 then continues to decrease as stored change from node N1 is discharged by drawing current I1 through transistor D3. When the voltage at N1 decreases below 5 volts (potential V2), diode D2 begins to conduct current, clamping N1 to a potential approximately equal to 5 volts less the threshold voltage of transistor D2. As the voltage at N2 continues to decrease towards zero volts, a negative gate to source potential is applied so as to cutoff transistor D1. This effect is achieved by clamping N1 (at the source electrode of D1) to a positive potential through forward biased diode D2 while allowing N2 (at the gate electrode of D1) to decrease to zero volts. Transistor D1 is now cutoff so that substantially zero current is drawn from the 25 volt power supply. Diode D2 is conductive, supplying current I1 through transistor current source D3. In order to maintain cutoff of transistor D1, transistor D2 must be a relatively high gain device compared to transistor D3. Transistor D2 can then readily supply the current I1 required by transistor D3, while providing only a small forward bias voltage drop.

When the signal potential at input terminal 10 again switches to 0 volts, transistor D5 is again rendered nonconductive. The capacitance at node N2 is charged by current I1 from current source D3 which is supplied through diode D2. As the potential on N1 increases above 5 volts less the threshold voltage of D2, diode D2 goes into a reversed biased condition. At that time, transistor D1 becomes conductive supplying charging current I1 to current source D3. As the voltage on node N2 approaches 25 volts, the current through D1 is reduced, until, in the steady state, substantially zero current flows from the 25 volt power supply.

The size of transistor D3 is selected as a tradeoff between competing factors. The larger the size of transistor D3, the greater will be the current I1, which increases the switching speed of the circuit. However, the larger the size of D3, the greater will be the required size of diode-connected transistor D2 so that D2 will be able to supply current I1 at a sufficiently small forward bias voltage drop. Threfore, D3 should be made large enough to assure adequate circuit switching speed, but not so large as to require an unduly large device size for transistor D2.

From the foregoing descriptive of circuit operation it can be seen that the high voltage driver of the present invention functions as a logical inverter circuit which translates a 5 volt input signal to a 25 volt output signal. Furthermore, the invented circuit has power consumption characteristics similar to a complementary symmetry circuit in that very little power supply current is drawn in the steady state and that most power supply current is drawn when switching from one state to the other.

A representative embodiment of transistors D1, D2, and D3, which comprise the static load arrangement, is shown in FIG. 3. All transistors are N-channel, silicon gate and are available in a silicon nitride oxide process used to fabricate an EEPROM IC product.

As shown in FIG. 3, D2 is constructed in a P well 20 on an N-type substrate 19. Source electrode 22 and drain electrode 24 of transistor D2 formed as N+ type regions within P well 20. The silicon gate region 26 overlies the active channel area 28 of transistor D2. The gate 26 and drain 24 electrodes of transistor D1 are connected to power supply potential V2 through a metalization layer 30.

Transistors D1 and D3 are constructed in a second P well 21 on substrate 19. Source electrode 36 and drain electrode 34 of transistor D3 are N+ type regions within P well 21. The silicon gate region 39 overlies the active channel area 38 of transistor D3. Note that the active channel area 38 of transistor D3 is arranged to have a high length to width ratio in order to provide a relatively low current device. In contrast, transistor D2 has a relatively low length to width ratio in order to provide a relatively higher current device.

Drain electrode 34 of transistor D2 also serves as the source electrode 34 transistor D1. The drain electrode 40 of transistor D1 is constructed as an N+ type region within N-type substrate 19. The silicon gate region 39 overlies the active channel area 42 of transistor D1.

Note that the silicon gate region 39 is common to transistors D1 and D3 thereby providing an interconnection between their respective gate electrodes. Since transistor D1 is only operated as a switch, it may be fabricated as a short channel, high gain device. A metalization layer 46 connects the common gate region 39 to the source electrode 36 of D3 at circuit node N2. A contact region 35 is provided to connect node N2 to the P well 21. Contact region 35 thus connects the body of transistors D1 and D3 to node N2. Although P well 21 may alternatively be connected to the substrate potential (typically 0 volts), the connection to node N2 tends to reduce the source body threshold effect which reduction increases the switching speed of the circuit, or conversely, permits the use of a lower depletion threshold device while decreasing the switching speed of the circuit still allows N2 to charge up to V1. Node N2 is also connected to a second layer of polysilicon 48 for further connection to a switching transistor and output node (not shown).

Metalization layer 32 connects the source electrode 22 of D2 to the common source and drain electrode 34 of transistors D1 and D2 respectively to form circuit node N1. Metalization layer 50 connects the drain electrode 40 of transistor D1 to the power supply terminal providing potential V1.

The static load circuit arrangement of D1, D2 and D3 has been shown for use in an inverter circuit. It will be understood by those skilled in the art that the static load circuit of the present invention may be used in other logic circuits such as NAND gates, NOR gates, and flip-flops.

What is claimed is:

1. A circuit comprising:
    a depletion mode FET having respective source, gate, and drain electrodes;
    a first power supply terminal to which said drain electrode of said depletion mode FET is connected;
    a unidirectional current conduction means having first and second electrodes for conducting current from said first to said second electrode thereof;
    a second power supply terminal to which said first electrode of said unidirectional current conduction means is connected;
    a current source means having first and second electrodes for conducting current between said first and second electrodes of said current source;
    a first circuit node to which said second electrode of said undirectional current conduction means, the first electrode of said current source and the source electrode of said depletion mode FET are connected; and
    a second circuit node to which the gate electrode of said depletion mode FET and the second electrode of said current source are connected.

2. A circuit in accordance with claim 1 further comprising:
    a switching means having a first electrode, a second electrode, and an input electrode, the potential voltage between said input and said first electrode controlling the conductivity between said first and second electrodes thereof;
    a third power supply terminal to which said first electrode of said switching means is connected;
    an input terminal to which said input electrode of said switching means is connected; and means for connecting said second electrode of said switching means to said second circuit node.

3. A circuit in accordance with claim 1 wherein said unidirectional current conduction means comprises a diode.

4. A circuit in accordance with claim 1 wherein said unidirectional current conduction means comprises an enhancement mode FET having respective source, gate, and drain electrodes wherein said drain and gate electrodes are interconnected to be said first electrode thereof, and said source electrode is said second electrode thereof.

5. A circuit in accordance with claim 1 wherein said current source means comprises a resistor.

6. A circuit in accordance with claim 1 wherein said current source means comprises a second depletion mode FET transistor having respective source, gate, and drain electrodes, said gate and source electrodes thereof being connected to said second circuit node, and said drain electrode thereof being connected to said first circuit node.

7. A circuit in accordance with claim 2 wherein said switching means comprises an enhancement mode FET having source, drain, and gate electrodes corresponding to said first, second, and input electrodes, respectively.

8. A circuit in accordance with claim 2 wherein said means for connecting the second electrode of said switching means to said second circuit node comprises a direct connection without substantial intervening impedance.

9. A circuit in accordance with claim 2 wherein said means for connecting said second electrode of said switching means to said second circuit node comprises a third depletion mode FET having respective source, gate, and drain electrodes wherein said source electrode is connected to the second electrode of said switching means, said drain electrode is connected to said second circuit node, and said gate electrode is connected to said second power supply terminal.

10. An inverter circuit comprising:
first and second depletion mode FET's having respective source, gate, and drain electrodes;
diode means having respective first and second electrodes for conducting unidirectional current between said first and second electrodes;
a first power supply terminal to which the drain electrode of said first depletion mode FET is connected;
a second power supply terminal to which said first electrode of said diode means is connected;
a first circuit node to which said source electrode of said first depletion mode FET, said first electrode of said diode means, and said drain electrode of said second depletion mode FET are connected;
a second circuit node to which said source electrode of said second depletion mode FET, and said respective gate electrodes of said first and second depletion mode FET's are connected;
switching means having respective first, second, and third electrodes, the potential between said first and third electrodes thereof selectively controlling the conductivity between said first and second electrodes, said second electrode of said switching means being connected to said second circuit node;
a third power supply terminal to which said first electrode of said switching means is connected; and
an input terminal to which said third electrode of said switching means is connected.

11. An inverter circuit in accordance with claim 10 wherein said diode means comprises;
an enhancement mode FET having respective source, gate, and drain electrodes; and
means for connecting said enhancement mode FET as a diode, said means including means for interconnecting said gate and drain electrodes of said enhancement mode FET.

* * * * *

Disclaimer 4,496,853.—*Ronald W. Streiber*, Smithtown, N.Y. STATIC LOAD FOR HIGH VOLTAGE DRIVER. Patent dated Jan. 29, 1985. Disclaimer filed Nov. 29, 1989, by the assignee, General Instrument Corporation.

Hereby enters this disclaimer to claims 1, 2, 3, 4, 6, 7, 8, 10 and 11 of said patent.
[ *Official Gazette January 30, 1990* ]